(12) United States Patent
Summerfelt et al.

(10) Patent No.: US 11,791,296 B2
(45) Date of Patent: *Oct. 17, 2023

(54) DIELECTRIC AND METALLIC NANOWIRE BOND LAYERS

(71) Applicant: TEXAS INSTRUMENTS INCORPORATED, Dallas, TX (US)

(72) Inventors: Scott Robert Summerfelt, Garland, TX (US); Benjamin Stassen Cook, Los Gatos, CA (US); Ralf Jakobskrueger Muenster, Saratoga, CA (US); Sreenivasan Kalyani Koduri, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 14 days.

This patent is subject to a terminal disclaimer.

(21) Appl. No.: 17/544,888

(22) Filed: Dec. 7, 2021

(65) Prior Publication Data
US 2022/0102307 A1 Mar. 31, 2022

Related U.S. Application Data

(63) Continuation of application No. 16/843,717, filed on Apr. 8, 2020, now Pat. No. 11,195,811.

(60) Provisional application No. 62/831,073, filed on Apr. 8, 2019, provisional application No. 62/831,057, filed on Apr. 8, 2019.

(51) Int. Cl.
*H01L 23/00* (2006.01)

(52) U.S. Cl.
CPC .............. *H01L 24/13* (2013.01); *H01L 24/27* (2013.01); *H01L 24/29* (2013.01); *H01L 24/32* (2013.01); *H01L 24/83* (2013.01); *H01L 2224/13005* (2013.01); *H01L 2224/13023* (2013.01); *H01L 2224/13026* (2013.01); *H01L 2224/13078* (2013.01); *H01L 2224/279* (2013.01); *H01L 2224/29078* (2013.01); *H01L 2224/3207* (2013.01); *H01L 2224/83895* (2013.01); *H01L 2224/83896* (2013.01)

(58) Field of Classification Search
None
See application file for complete search history.

(56) References Cited

U.S. PATENT DOCUMENTS

| | | |
|---|---|---|
| 6,297,063 B1 | 10/2001 | Brown et al. |
| 6,340,822 B1 | 1/2002 | Brown et al. |
| 6,989,325 B2 | 1/2006 | Uang et al. |

(Continued)

FOREIGN PATENT DOCUMENTS

| | | | | |
|---|---|---|---|---|
| DE | 102018128584 A1 | * | 5/2019 | ............. H01L 24/03 |
| EP | 1583146 A2 | * | 10/2005 | ........... B81B 7/0006 |

(Continued)

*Primary Examiner* — Scott B Geyer
(74) *Attorney, Agent, or Firm* — Dawn Jos; Frank D. Cimino

(57) ABSTRACT

In some examples, an electronic device comprises a first component having a surface, a second component having a surface, and a bond layer positioned between the surfaces of the first and second components to couple the first and second components to each other. The bond layer includes a set of metallic nanowires and a dielectric portion. The dielectric portion comprises a polymer matrix and dielectric nanoparticles.

19 Claims, 10 Drawing Sheets

(56) References Cited

U.S. PATENT DOCUMENTS

| | | |
|---|---|---|
| 7,268,423 B2 | 9/2007 | Beer et al. |
| 7,301,779 B2 | 11/2007 | Honlein et al. |
| 7,633,148 B2 | 12/2009 | Awano et al. |
| 7,906,354 B1 | 3/2011 | Ellinger et al. |
| 7,960,653 B2 | 6/2011 | Wang et al. |
| 8,912,637 B1 * | 12/2014 | Zhang .................... H01L 24/83 257/676 |
| 9,601,406 B2 * | 3/2017 | Jha ......................... H01L 24/32 |
| 9,601,452 B2 * | 3/2017 | Starkovich .......... H01L 23/3737 |
| 9,679,806 B1 * | 6/2017 | Arvin ................. H01L 25/0657 |
| 9,871,014 B2 | 1/2018 | Haba |
| 2005/0006754 A1 * | 1/2005 | Arik ....................... H01L 24/13 257/E23.098 |
| 2005/0224975 A1 | 10/2005 | Basavanhally et al. |
| 2006/0068195 A1 | 3/2006 | Majumdar et al. |
| 2006/0113656 A1 | 6/2006 | Uang et al. |
| 2006/0243958 A1 | 11/2006 | Suh et al. |
| 2007/0148949 A1 * | 6/2007 | Suh ........................ H01L 24/13 257/E21.511 |
| 2007/0267735 A1 * | 11/2007 | Awano .................... H01L 24/91 977/932 |
| 2008/0050512 A1 * | 2/2008 | Lower ................... H01L 21/563 257/E21.503 |
| 2008/0185718 A1 * | 8/2008 | Suh ........................ H01L 24/81 257/E21.511 |
| 2008/0224327 A1 * | 9/2008 | Suh ........................ H01L 24/13 257/782 |
| 2008/0227294 A1 * | 9/2008 | Suh ........................ C25D 13/04 438/687 |
| 2008/0237822 A1 * | 10/2008 | Raravikar ............ H01L 23/295 257/E23.117 |
| 2008/0308953 A1 * | 12/2008 | Autumn .................. H01L 24/11 257/E23.021 |
| 2009/0072408 A1 * | 3/2009 | Kabir ...................... B32B 37/06 257/773 |
| 2009/0104766 A1 * | 4/2009 | Gomi ................... B23K 1/0016 257/E21.478 |
| 2010/0018747 A1 * | 1/2010 | Wang ..................... B82Y 10/00 29/745 |
| 2010/0072617 A1 * | 3/2010 | Supriya ............... H01L 25/0657 257/737 |
| 2011/0240099 A1 | 10/2011 | Ellinger et al. |
| 2011/0240953 A1 | 10/2011 | Ellinger et al. |
| 2012/0218715 A1 | 8/2012 | Hirose et al. |
| 2013/0234313 A1 | 9/2013 | Wainerdi et al. |
| 2013/0256868 A1 * | 10/2013 | Aliyev .................... H01L 21/50 257/713 |
| 2013/0337236 A1 * | 12/2013 | Cott ....................... B82Y 10/00 427/535 |
| 2014/0246770 A1 | 9/2014 | Jha et al. |
| 2015/0054019 A1 * | 2/2015 | Rhee ....................... H01L 24/29 257/99 |
| 2019/0103378 A1 | 4/2019 | Escher-Poeppel et al. |
| 2020/0279821 A1 | 9/2020 | Haba et al. |

FOREIGN PATENT DOCUMENTS

| | | | | |
|---|---|---|---|---|
| WO | WO-2009008842 A1 * | 1/2009 | ............ | B82Y 10/00 |
| WO | WO-2009035393 A1 * | 3/2009 | ............ | B32B 37/06 |

* cited by examiner

DIELECTRIC AND METALLIC NANOWIRE BOND LAYERS

CROSS-REFERENCE TO RELATED APPLICATIONS

This application is a continuation to U.S. application Ser. No. 16/843,717, filed Apr. 8, 2020, which claims priority to U.S. Provisional Patent Application No. 62/831,057, filed Apr. 8, 2019, and titled "Dielectric Nanowire Growth," and to U.S. Provisional Patent Application No. 62/831,073, filed Apr. 8, 2019, and titled "Dielectric And Metallic Nanowire Attach," both of which are hereby incorporated herein by reference in their entireties.

BACKGROUND

Electronic devices contain various components that couple to each other. For example, an electronic device may contain a semiconductor package that couples to components external to the package, such as printed circuit boards (PCBs). Similarly, semiconductor devices may contain various components that are coupled to each other. For example, within semiconductor packages, semiconductor dies may couple to die pads, other dies, conductive terminals, etc. The connection between any two components in an electronic device or system may include electrically conductive portions as well as insulative portions.

SUMMARY

In some examples, an electronic device comprises a first component having a surface, a second component having a surface, and a bond layer positioned between the surfaces of the first and second components to couple the first and second components to each other. The bond layer includes a set of metallic nanowires and a dielectric portion. The dielectric portion comprises a polymer matrix and dielectric nanoparticles.

In some examples, a method for fabricating an electronic device comprises positioning a metal layer above a surface of a component and plating a set of metallic nanowires on the metal layer. The method also comprises positioning a dielectric layer above the surface of the component, the dielectric layer comprising a polymer matrix, a solvent, and a set of nanoparticles. The metal layer and the dielectric layer are positioned above different portions of the surface of the component.

BRIEF DESCRIPTION OF THE DRAWINGS

For a detailed description of various examples, reference will now be made to the accompanying drawings in which.

DETAILED DESCRIPTION

As explained above, connections (or "bond layers") between various components may include both electrically conductive as well as insulative portions. The types of materials conventionally used for both the conductive and insulative portions of the bond layers—for example, solder joints, liquid epoxies, and the like—deliver suboptimal mechanical adhesive strength, poor electrical and thermal conductivity, and coefficient of thermal expansion (CTE) mismatches (e.g., with abutting semiconductor substrates) that are deleterious to the structural integrity of the bond layers.

This disclosure describes various examples of a dielectric and metallic nanowire bond layer that is usable to bond together two or more components in an electronic device. The metallic nanowire portion of the bond layer provides mechanical adhesion and electrical and thermal conductivity between the components. The dielectric portion of the bond layer provides mechanical adhesion, thermal conductivity, and insulation between the components. Advantages of the dielectric and metallic nanowire bond layer include improved strength of mechanical adhesion between components, improved electrical and thermal conductivity between components, and improved CTE matching with abutting materials (e.g., a semiconductor substrate).

Figure 9:
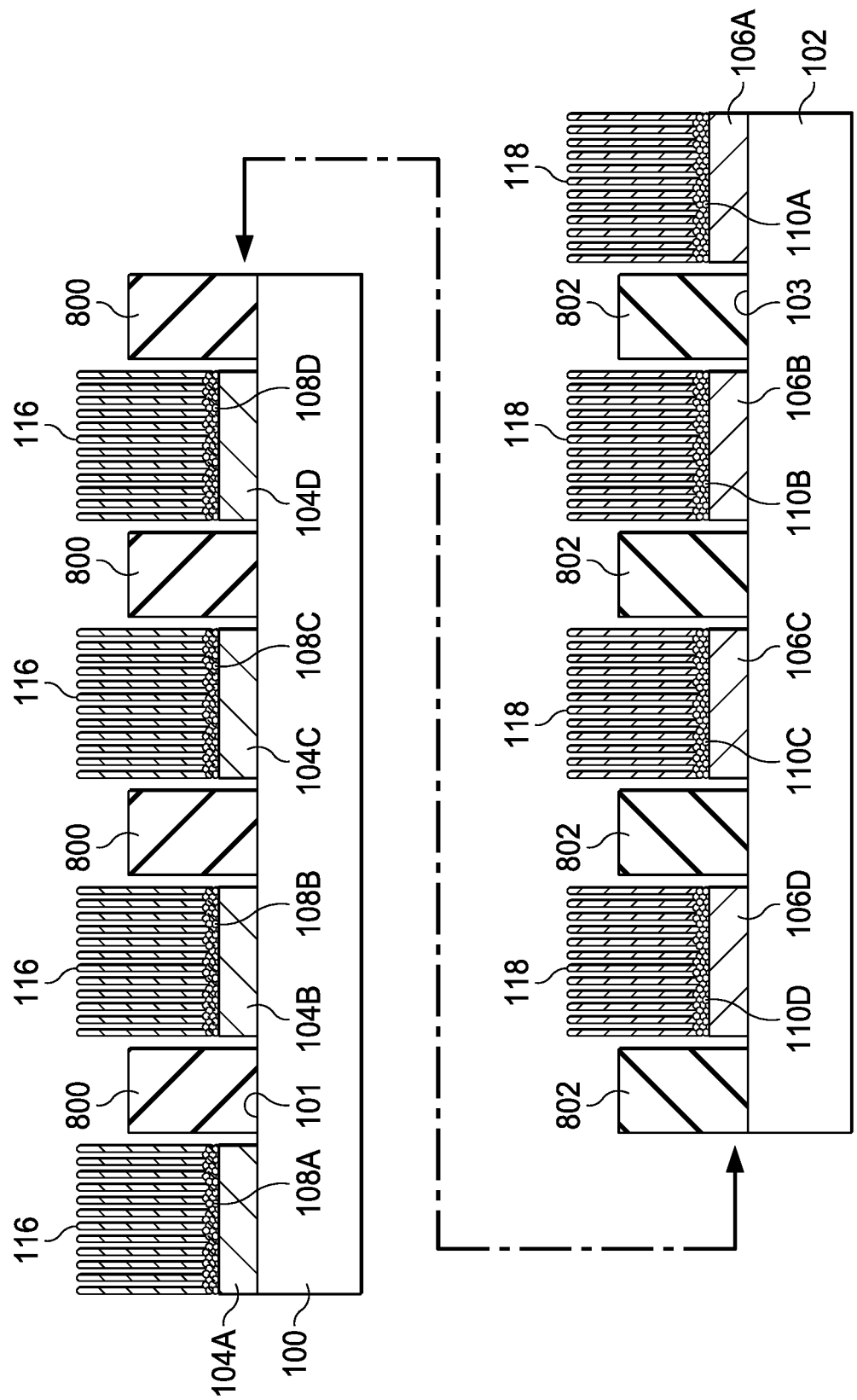
FIG. 9 depicts two components to be coupled to each other, each component having a metal layer, a set of nanoparticles, a set of metallic nanowires, and a porous dielectric layer positioned thereupon, in accordance with various examples.
Figure 10:
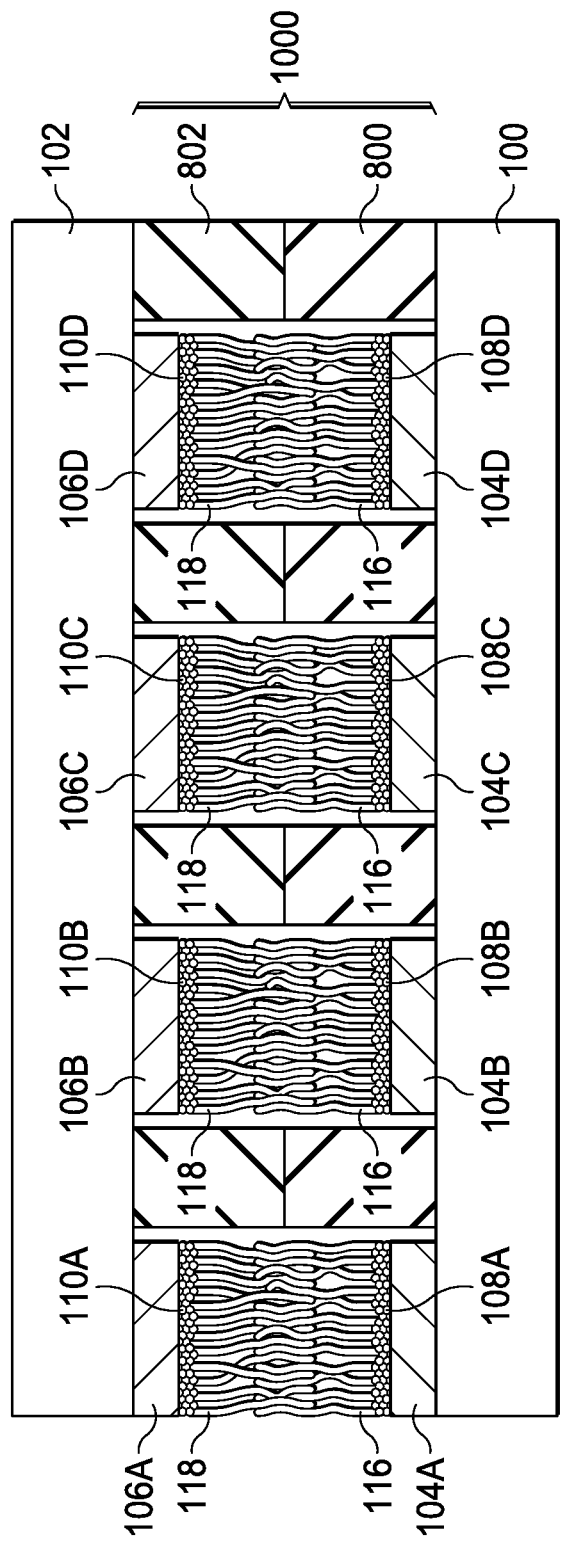
FIG. 10 depicts two components coupled to each other using a bond layer, the bond layer comprising metallic nanowires coupled to each other and dielectric layers coupled to each other, in accordance with various examples.
Figure 11:
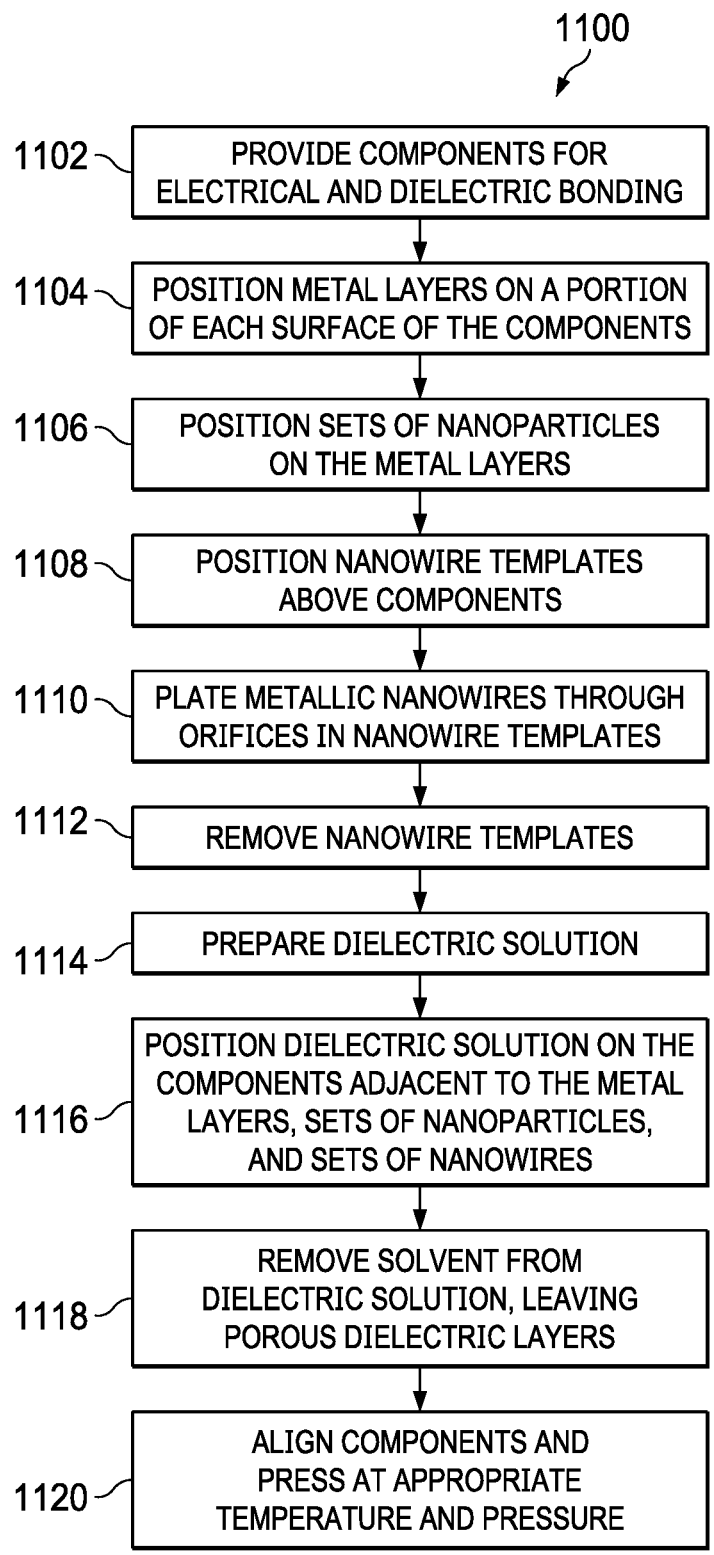
FIG. 11 depicts a flow diagram of a method for coupling two components together using a dielectric and metallic nanowire bond layer, in accordance with various examples.

FIGS. 1-10 depict an example process flow for fabricating a dielectric and metallic nanowire bond layer between any two components. FIG. 11 depicts a flow diagram of a method 1100 that corresponds to the process flow of FIGS. 1-10. Accordingly, the method of FIG. 11 is now described, with parallel references to FIGS. 1-10 so that the method and the process flow may be described in tandem.

Figure 1:
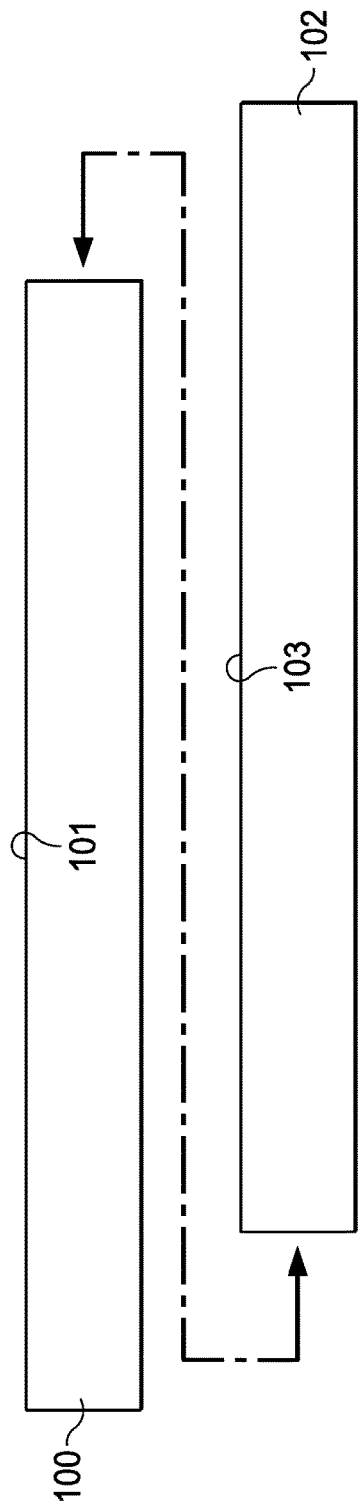
FIG. 1 depicts two components to be coupled to each other, in accordance with various examples.

The method 1100 begins by providing components for electrical and dielectric bonding (step 1102). FIG. 1 depicts the provision of a pair of components 100, 102. The components 100, 102 may be components in any context. The remainder of this disclosure assumes that the context is that of electronic devices, and thus, the components 100, 102 are electrical components of any type. For example, the components 100, 102 may be semiconductor dies, die pads, conductive terminals (e.g., package leads), semiconductor packages, printed circuit boards (PCBs), etc. However, in other contexts not described in detail herein, the components 100, 102 could be any set of components that would or could benefit from both electrical and insulative connections but that would not be classified as being an electronic device or system per se. In addition, the remainder of this disclosure assumes that two components 100, 102 are to be coupled using the dielectric and metallic nanowire bond layers described herein, but the bond layers described herein may be used to couple together any number of components.

Figure 2:
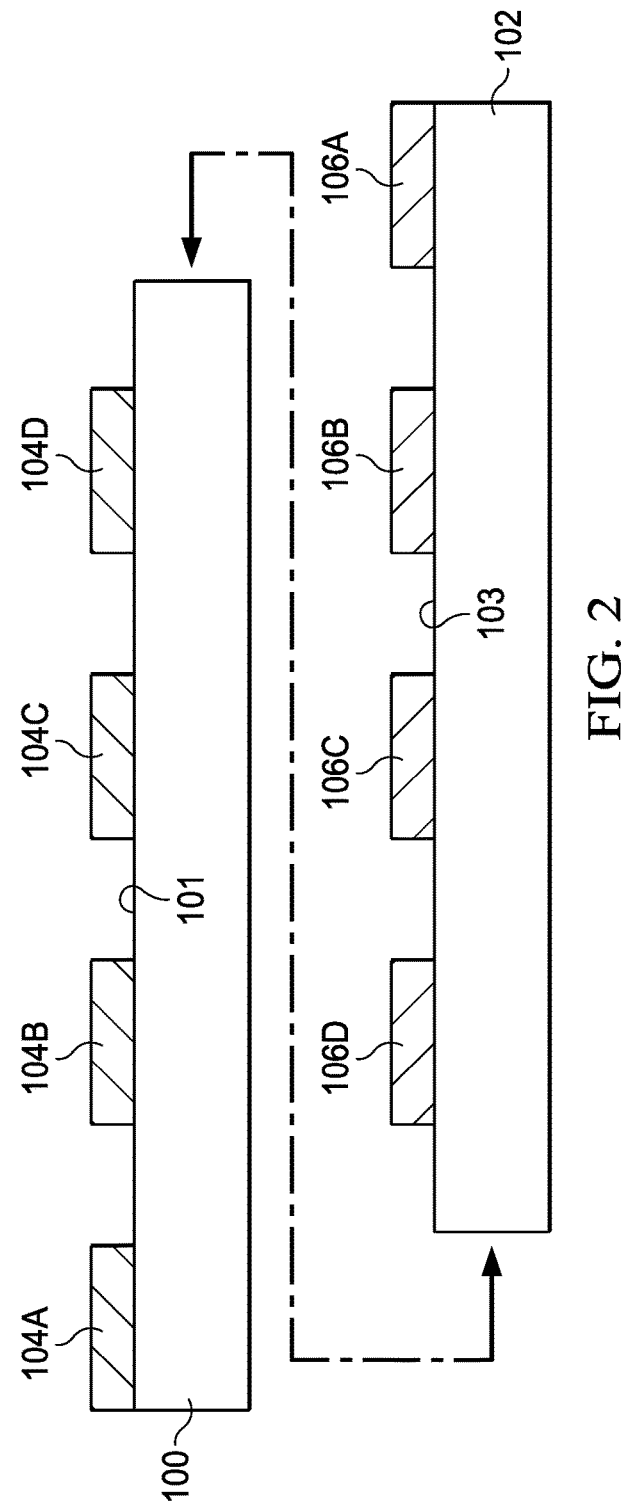
FIG. 2 depicts two components to be coupled to each other, each component having a metal layer positioned thereupon, in accordance with various examples.

Still referring to FIG. 11, the method 1100 next comprises positioning metal layers on a portion of each surface of the components (step 1104). FIG. 2 depicts metal layers 104A-104D positioned on a surface 101 of the component 100. Similarly, FIG. 2 depicts metal layers 106A-106D positioned on a surface 103 of the component 102. Each of the metal layers 104A-104D and 106A-106D is deposited using any suitable technique, for example, a printing technique (e.g., additive manufacturing), a sputtering technique, or a plating technique. In some examples, each of the metal layers 104A-104D and 106A-106D comprises a solid metal layer. In some examples, each of the metal layers 104A-104D and 106A-106D comprises copper. In some examples, each of the metal layers 104A-104D and 106A-106D comprises titanium. In some examples, each of the metal layers 104A-104D and 106A-106D comprises titanium-tungsten. In some examples, each of the metal layers 104A-104D and 106A-106D comprises nickel palladium. In some examples, each of the metal layers 104A-104D and 106A-106D comprises a different metal or metal alloy than those recited above. In some examples, the metal layers 104A-104D and 106A-106D have the same composition, and in other examples, one or more of the metal layers 104A-104D and 106A-106D has a different composition than the other metal layers. Any of a variety of metals or metal alloys may be used, depending on various factors including cost, electromigration between metals, availability, etc. The physical parameters of the metal layers 104A-104D and 106A-106D, such as length, width, and thickness, are variable and may be selected as desired, with one or more of the metal layers 104A-104D and 106A-106D having the same or different physical parameters compared to the remaining metal layers.

Figure 3:
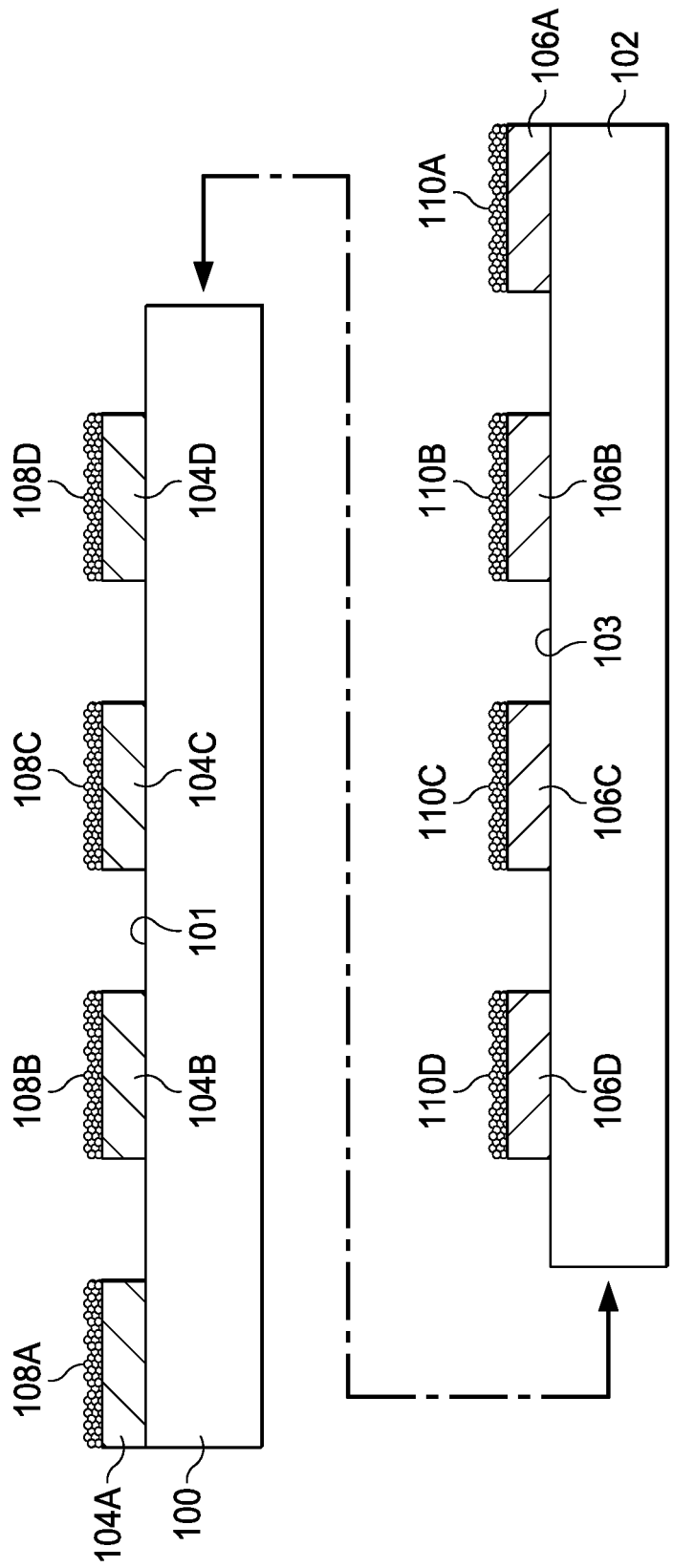
FIG. 3 depicts two components to be coupled to each other, each component having a metal layer and a set of nanoparticles positioned thereupon, in accordance with various examples.

Still referring to FIG. 11, the method 1100 next includes positioning sets of metallic nanoparticles on the metal layers (step 1106). FIG. 3 depicts sets of metallic nanoparticles 108A-108D positioned on metal layers 104A-104D, respectively. FIG. 3 also depicts sets of metallic nanoparticles 110A-110D positioned on metal layers 106A-106D, respectively. In some examples, the metals in the sets of metallic nanoparticles 108A-108D, 110A-110D and the metal layers 104A-104D, 106A-106D are identical (e.g., copper, titanium, or titanium-tungsten). In other examples, the metals in the sets of metallic nanoparticles are different than those in the metal layers. For instance, in some examples, the sets of metallic nanoparticles 108A-108D, 110A-110D comprise titanium or titanium-tungsten, and the metal layers 104A-104D, 106A-106D comprise copper. In some examples, the sets of metallic nanoparticles 108A-108D, 110A-110D comprise nickel palladium, and the metal layers 104A-104D, 106A-106D comprise copper. Any of a variety of metals may be used, depending on various factors including cost, electromigration between metals, availability, etc.

In some examples, the sets of metallic nanoparticles 108A-108D, 110A-110D are deposited on the metal layers 104A-104D, 106A-106D using a printing technique, for example, an additive manufacturing technique. In some examples, the sets of metallic nanoparticles 108A-108D, 110A-110D are electroplated onto the metal layers 104A-104D, 106A-106D. In some examples, the sets of metallic nanoparticles 108A-108D, 110A-110D are deposited using a sputtering technique. Other techniques are contemplated and included in the scope of this disclosure.

In some examples, the sets of metallic nanoparticles 108A-108D, 110A-110D have a thickness ranging from 100 nanometers (nm) to 100 microns, with a thicker set of nanoparticles resulting in a more mechanically stable nanoparticle-nanowire structure. In some examples, the length and width of each of the sets of metallic nanoparticles 108A-108D, 110A-110D is less than the width and length of the corresponding metal layer 104A-104D, 106A-106D. For instance, in some examples, the width of each set of metallic nanoparticles 108A-108D, 110A-110D is 75%-100% of the width of the corresponding metal layer 104A-104D, 106A-106D. In some examples, the width of each set of metallic nanoparticles 108A-108D, 110A-110D is 50%-75% of the width of the corresponding metal layer 104A-104D, 106A-106D. In some examples, the width of each set of metallic nanoparticles 108A-108D, 110A-110D is 25%-50% of the width of the corresponding metal layer 104A-104D, 106A-106D. Other relative sizes are contemplated and included in the scope of this disclosure. Similar relative sizes may be used for the lengths of the sets of metallic nanoparticles 108A-108D, 110A-110D and the corresponding metal layers 104A-104D, 106A-106D. These relative length and width selections are not mere design choices; rather, they result in different levels of mechanical strength and current carrying capability of the metallic nanowires described below, due to the ability of larger sets of nanoparticles to couple to greater numbers of metallic nanowires, and vice versa. The length and width selections may also affect melting points of the sets of metallic nanoparticles, with larger sets of metallic nanoparticles having higher melting points, and vice versa. The remaining dimensions of the sets of metallic nanoparticles 108A-108D, 110A-110D may be chosen as desired.

In some examples, each nanoparticle in the sets of metallic nanoparticles 108A-108D, 110A-110D is generally spherical and has a diameter ranging from approximately 0.5 microns to 1.5 microns. In some examples, each nanoparticle in the sets of metallic nanoparticles 108A-108D, 110A-110D has a diameter of 1.5 microns or less. The diameter may affect, for example, the melting point of a nanoparticle and thus is not merely a design choice. The specific physical parameters of the sets of metallic nanoparticles 108A-108D, 110A-110D and the individual nanoparticles within the sets of metallic nanoparticles 108A-108D, 110A-110D may vary, and all such variations are encompassed within the scope of this disclosure. The lengths, widths, and thicknesses of the metal layers 104A-104D, 106A-106D may be chosen as desired. Similarly, the number of metal layers (and attendant sets of nanoparticles) may be chosen as desired, with certain applications benefiting from more and other applications benefiting from fewer.

In some examples, metallic nanoparticles are positioned on solid metal layers. In some examples, metallic nanoparticles are deposited on a non-metallic surface. In some examples, metallic nanoparticles are omitted. Thus, the term "metal layer" may be used herein to denote a solid metal layer, a set of metallic nanoparticles, or a combination thereof.

After the sets of metallic nanoparticles 108A-108D, 110A-110D are deposited onto the metal layers 104A-104D,

106A-106D, the sets of metallic nanoparticles 108A-108D, 110A-110D are melted to cause the nanoparticles in the sets of metallic nanoparticles 108A-108D, 110A-110D to diffuse into the metal layers 104A-104D, 106A-106D. Any suitable technique may be used to melt the sets of metallic nanoparticles 108A-108D, 110A-110D, for example, a laser technique or a technique using any other heat source. The diameters of the nanoparticles in the sets of metallic nanoparticles 108A-108D, 110A-110D, as well as the thicknesses of the sets of metallic nanoparticles 108A-108D, 110A-110D, may at least partially determine the melting points of the sets of metallic nanoparticles 108A-108D, 110A-110D. In some examples, a nanoparticle diameter of approximately 1 micron and a thickness for each of the sets of metallic nanoparticles 108A-108D, 110A-110D of approximately 100 nm may result in a melting point of approximately 200 degrees Fahrenheit, although the specific number can vary based on a variety of factors (e.g., metal used, physical parameters of the nanoparticles in the sets of metallic nanoparticles 108A-108D, 110A-110D).

Figure 4:
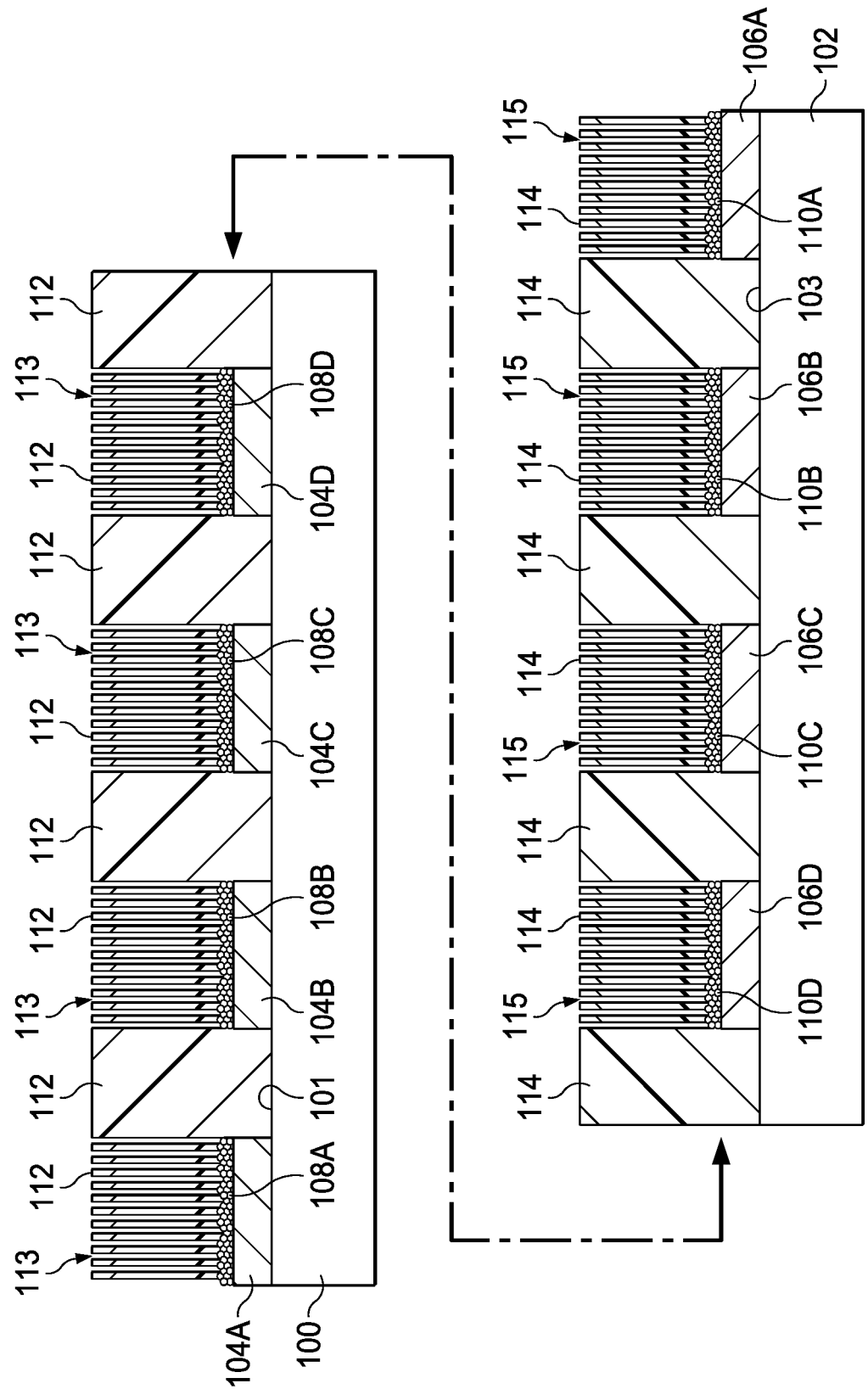
FIG. 4 depicts two components to be coupled to each other, each component having a metal layer, a set of nanoparticles, and a nanowire template positioned thereupon, in accordance with various examples.

Still referring to FIG. 11, the method 1100 next comprises positioning nanowire templates above the components (step 1108). FIG. 4 depicts structures identical to that of FIG. 3, but with nanowire template 112 positioned above the component 100 (e.g., abutting the component 100, the metal layers 104A-104D, and/or the sets of metallic nanoparticles 108A-108D) and with nanowire template 114 positioned above the component 102 (e.g., abutting the component 102, the metal layers 106A-106D, and/or the sets of metallic nanoparticles 110A-110D). The nanowire template 112 includes orifices 113 positioned above the sets of metallic nanoparticles 108A-108D, and the nanowire template 114 includes orifices 115 positioned above the sets of metallic nanoparticles 110A-110D. The orifices 113, 115 extend perpendicularly to the sets of metallic nanoparticles 108A-108D, 110A-110D. These nanowire templates 112, 114 may comprise, for example, TEFLON® (polytetrafluoroethylene) filters. In other examples, the nanowire templates 112, 114 comprise plastic. In some examples, the nanowire templates 112, 114 comprise any suitable type of metal (e.g., anodized aluminum or nickel). Although not expressly depicted in the drawings, in the event that the nanowire templates 112, 114 do not firmly adhere to the structures that they abut, a layer of photoresist may be positioned between such structures and the nanowire templates 112, 114 to increase adhesion. The photoresist may be shaped as needed using appropriate photolithography steps.

Figure 5:
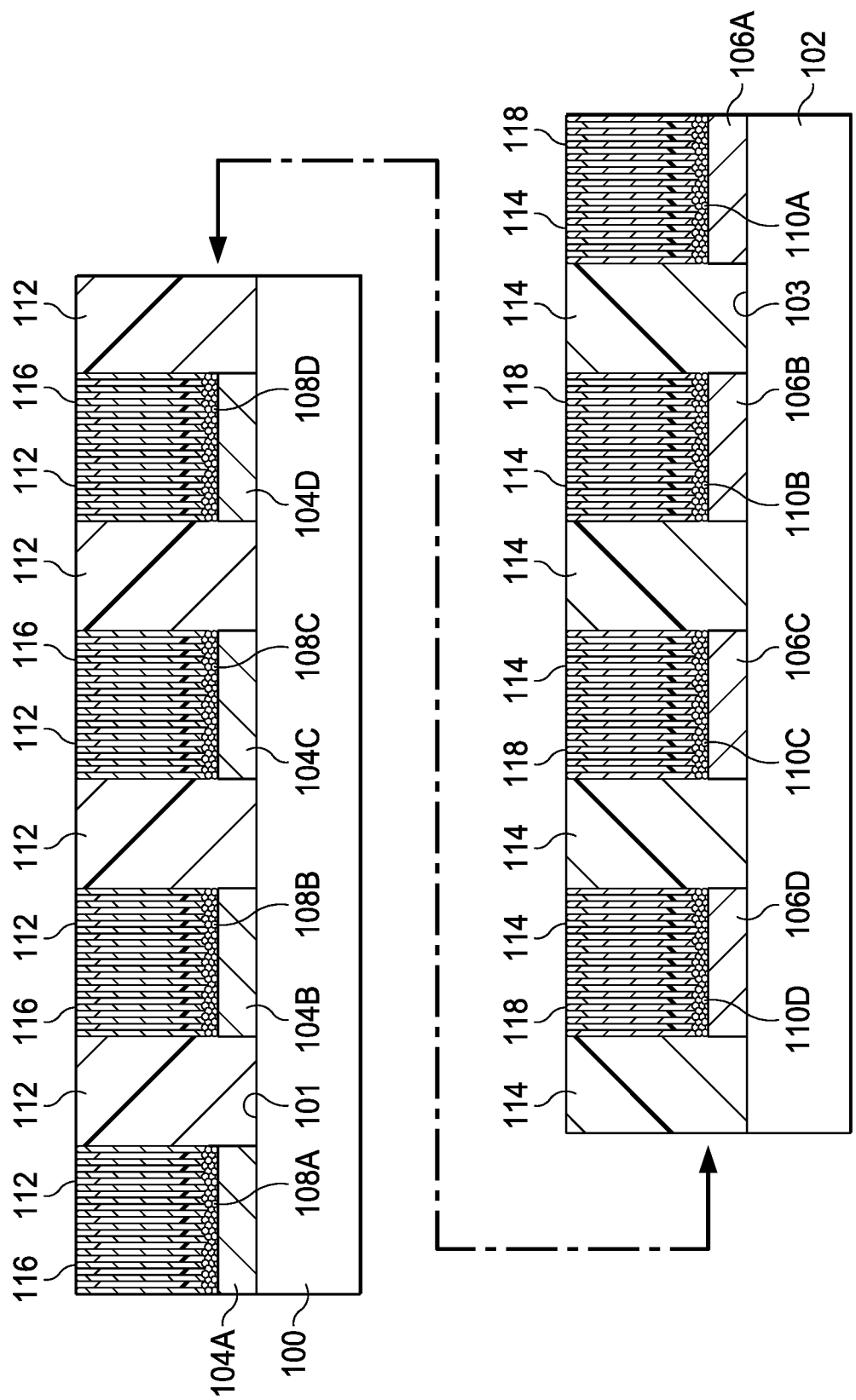
FIG. 5 depicts two components to be coupled to each other, each component having a metal layer, a set of nanoparticles, a nanowire template, and a set of metallic nanowires positioned thereupon, in accordance with various examples.

Still referring to FIG. 11, the method 1100 next comprises plating metallic nanowires through the orifices in the nanowire templates (step 1110). For example, an electroplating technique may be used to grow metallic nanowires in the orifices of the nanowire templates. FIG. 5, for instance, depicts plated metallic nanowires 116 in the orifices 113 (FIG. 4) of the nanowire template 112, and, similarly, FIG. 5 depicts plated metallic nanowires 118 in the orifices 115 (FIG. 4) of the nanowire template 114.

Any suitable metal may be used when plating the sets of metallic nanowires 116, 118. In some examples, gold is used to plate the sets of metallic nanowires 116, 118. In some examples, copper is used to plate the sets of metallic nanowires 116, 118. In some examples, titanium is used to plate the sets of metallic nanowires 116, 118. In some examples, tungsten is used to plate the sets of metallic nanowires 116, 118.

Referring briefly to FIG. 4, in some examples, the orifices 113, 115 (in FIG. 5, filled by the sets of metallic nanowires 116, 118) in the nanowire templates 112, 114 are sized appropriately to form wires at a nanoscale. For example, a nanowire in the sets of metallic nanowires 116, 118 may have a length that is at least twice its diameter. In some examples, a nanowire in the sets of metallic nanowires 116, 118 has a length that is at least 10 times its diameter. In some examples, a nanowire in the sets of metallic nanowires 116, 118 has a length that is at least 100 times its diameter. In some examples, a nanowire in the sets of metallic nanowires 116, 118 has a length that is at least 1000 times its diameter. In some examples, a nanowire in the sets of metallic nanowires 116, 118 has a diameter ranging from 0.5 microns to 1.5 microns. In some examples, a nanowire in the sets of metallic nanowires 116, 118 has a diameter of 1 micron. In some examples, a nanowire in the sets of metallic nanowires 116, 118 has a diameter ranging from 0.1 microns to 1 millimeter. In some examples, a nanowire in the sets of metallic nanowires 116, 118 has a length of at least 2 microns. In some examples, a nanowire in the sets of metallic nanowires 116, 118 has a diameter ranging from 5 nanometers to 100 microns and a length ranging from 10 microns to 1000 microns. In other examples, other diameters and length-to-diameter ratios of metallic nanowires are contemplated, and all such measurements and combinations fall within the scope of this disclosure. The orifices 113, 115 may have dimensions similar to the example dimensions given for the nanowires above.

The various dimensions described for the sets of metallic nanowires 116, 118 (and the orifices 113, 115) are not mere design choices. Rather, adjusting each dimension to be larger or smaller may provide specific functional benefits. For example, adjusting a nanowire length to be greater and/or a nanowire diameter to be smaller, such that the ratio of length to diameter increases, may increase the surface area-to-volume ratio of the nanowire. Increasing the surface area-to-volume ratio of the nanowire increases the number of defects present, thereby depressing the melting point of the nanowire and making it easier to fuse the nanowire to other materials without requiring high temperature or pressure.

Figure 6:
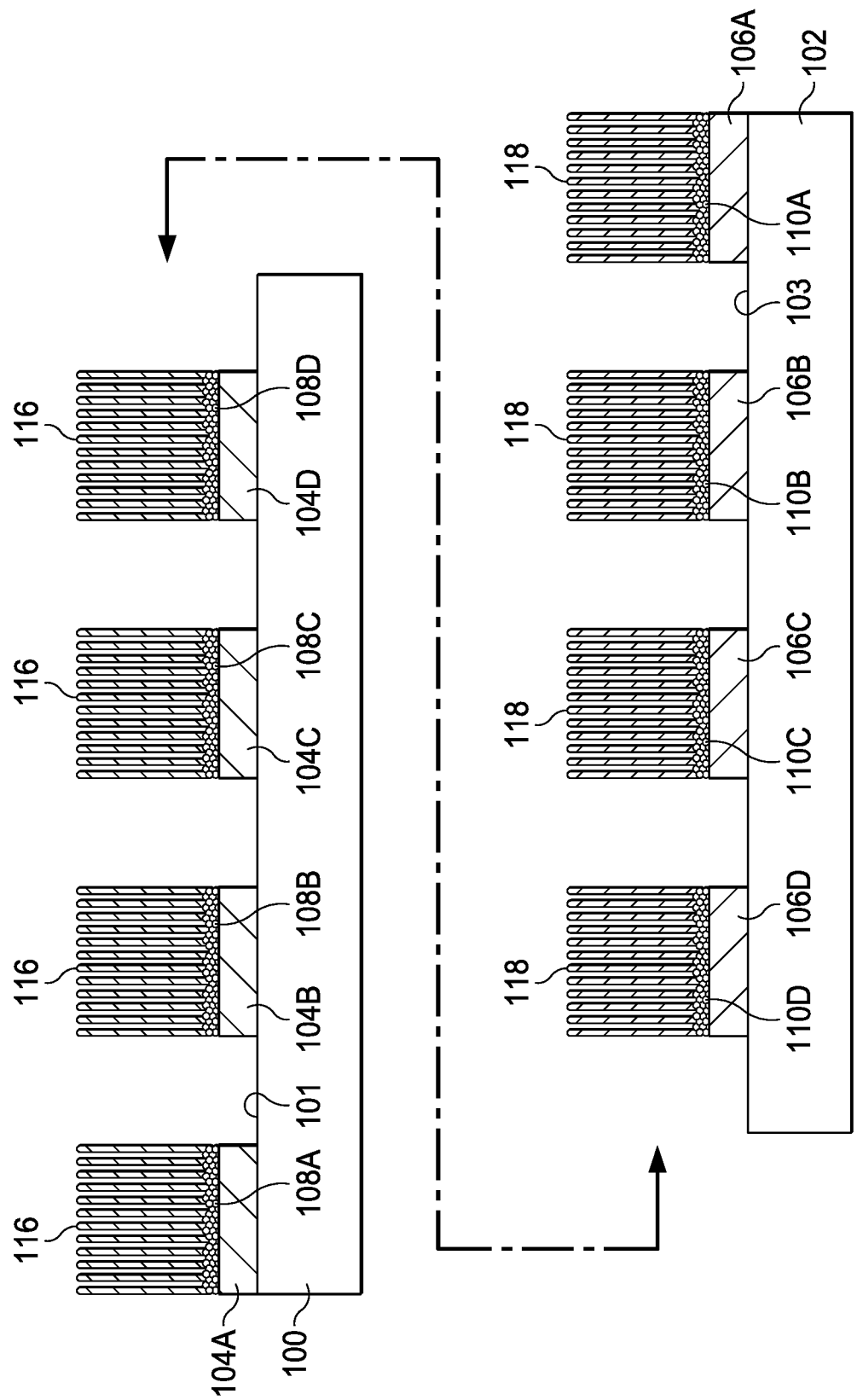
FIG. 6 depicts two components to be coupled to each other, each component having a metal layer, a set of nanoparticles, and a set of metallic nanowires positioned thereupon, in accordance with various examples.

Referring to FIG. 11, the method 1100 comprises removing the nanowire templates (step 1112). FIG. 6 depicts the structures of FIG. 5, except that the nanowire templates 112, 114 are removed. Removal of the nanowire templates 112, 114 (as well as any photoresist that may have been deposited beneath the nanowire templates 112, 114 to improve adhesion, as described above) leaves components 100, 102 having positioned thereupon the metal layers 104A-104D, 106A-106D, respectively, with sets of metallic nanoparticles 108A-108D, 110A-110D positioned on the metal layers 104A-104D, 106A-106D, respectively. Sets of metallic nanowires 116 extend from the sets of metallic nanoparticles 108A-108D, and sets of metallic nanowires 118 extend from the sets of metallic nanoparticles 110A-110D.

Figure 7A:
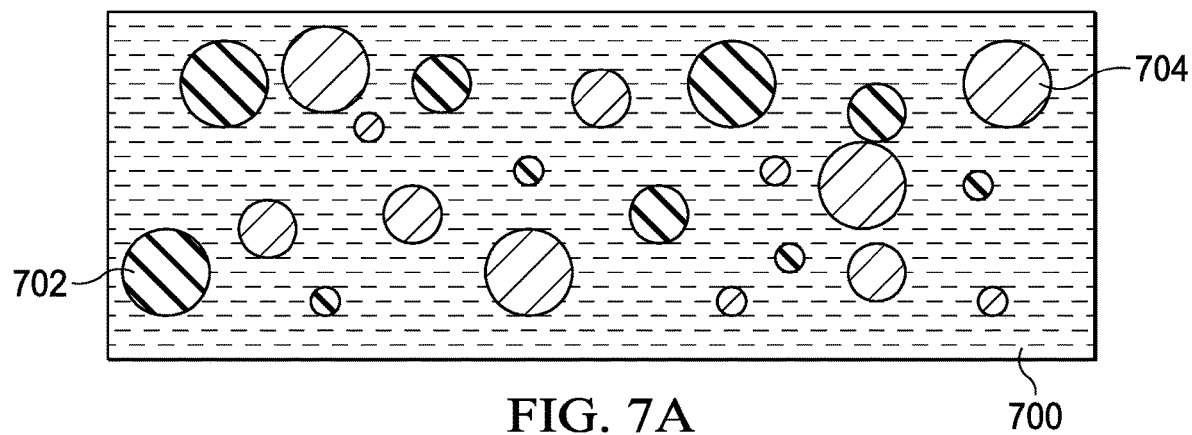
FIGS. 7A and 7B depict the fabrication of a dielectric layer, in accordance with various examples.

Still referring to FIG. 11, the method 1100 comprises preparing a dielectric solution (step 1114). FIG. 7A depicts the mixture of a polymer, dielectric nanoparticles (which, in examples, are optional), and a solvent to produce a dielectric material that is to be subsequently deposited on the surfaces 101, 103 of the components 100, 102, respectively. In FIG. 7A, numeral 700 represents the solvent, numeral 702 represents the polymer particles, and numeral 704 represents the dielectric nanoparticles. In examples, the solvent may include trichloroethylene, acetone, isopropanol, denatured ethanol, water, or any other suitable solvent. In examples, the polymer may include low-density polyethylene (LDPE), high-density polyethylene (HDPE), polypropylene (PP), polystyrene, polyethylene terephthalate (PET), polymethyl methacrylate (PMMA), polytetrafluorethylene (PTFE), polyvinyl chloride (PVC), polyetheretherketone (PEEK), polycarbonate (PC), polybutylene terephthalate (PBT), polyimide, silicone, epoxy, SU-8, nylon, etc. In examples, the dielectric nanoparticles may include aluminum oxide, aluminum nitride, silicon nitride, silicon oxide, silicon carbide, zinc oxide, beryllium oxide, boron nitride, barium titanate, diamond, mullite, other ceramics, or any other suitable dielectric. In some examples, the dielectric particles may be sized to maximize particle density.

The dielectric nanoparticles 704, in examples, have physical characteristics similar to the metallic nanoparticles described above. In examples, the dielectric nanoparticles 704 are optional and may be used in the solution of FIG. 7A or omitted from the solution of FIG. 7A. One benefit to including the dielectric nanoparticles 704 in the solution of FIG. 7A is that the particles may improve thermal conductivity and CTE (relative to abutting structures/materials, such as component 100 or 102, as described below) matching in the finished, bonded structure once the method 1100 is complete. In general, the materials in the dielectric solution may be manipulated to result in desirable dielectric properties, for example, resistance, dielectric breakdown thresholds, dielectric loss, real capacitance, imaginary capacitance, adhesion, strength, thermal expansion, thermal conductivity, and/or any of a variety of other specific properties.

Figure 8:
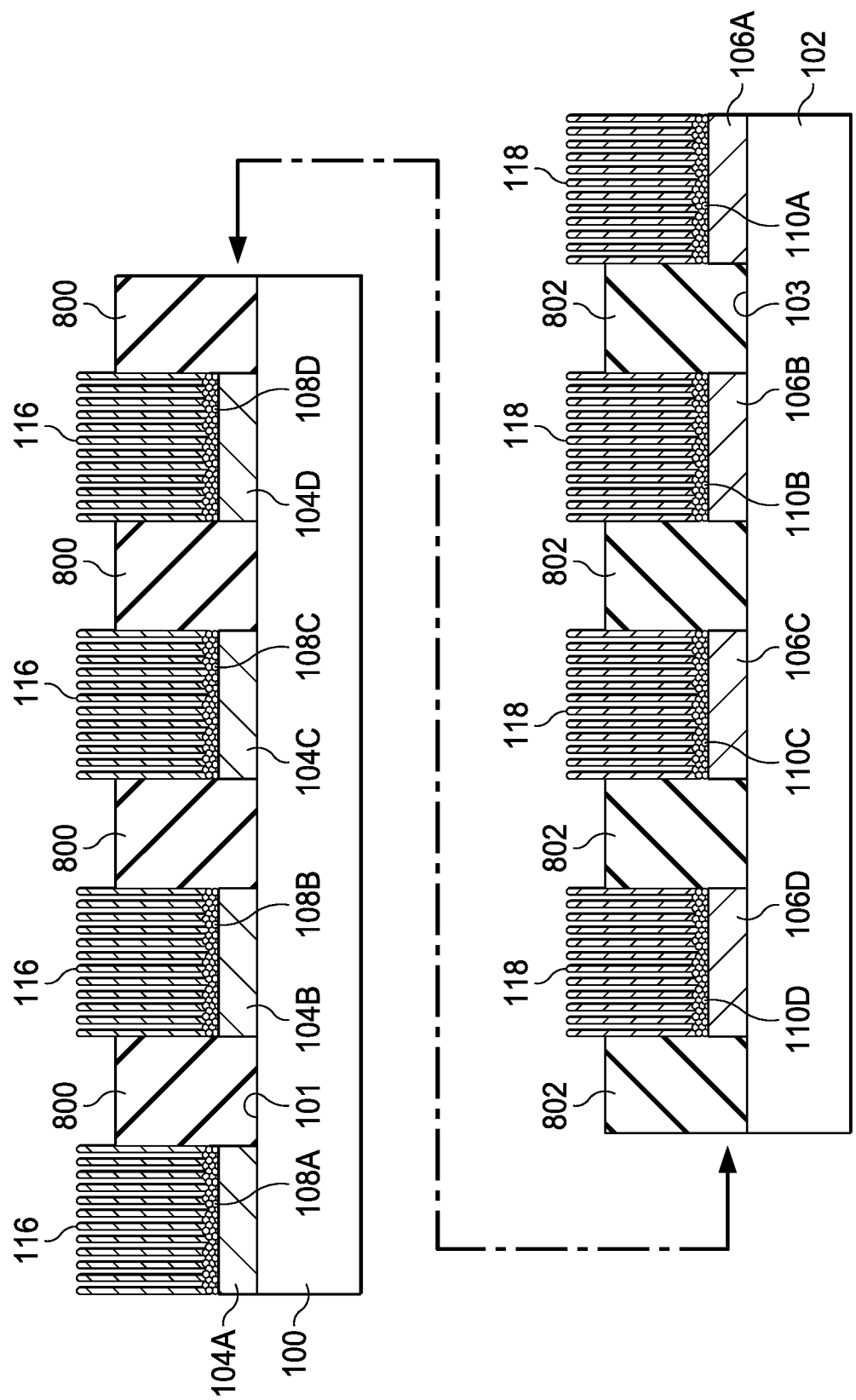
FIG. 8 depicts two components to be coupled to each other, each component having a metal layer, a set of nanoparticles, a set of metallic nanowires, and a dielectric layer positioned thereupon, in accordance with various examples.

Still referring to FIG. 11, the method 1100 next comprises positioning the dielectric solution on the surfaces of the components, adjacent to the metal layers, sets of metallic nanoparticles, and sets of metallic nanowires (step 1116). FIG. 8 depicts the structure of FIG. 6, but with the addition of dielectric solution 800 on the surface 101 of the component 100, and the addition of dielectric solution 802 on the surface 103 of the component 102. As shown, the dielectric solution 800 is applied to areas of the surface 101 not occupied by metallic structures. Similarly, as shown, the dielectric solution 802 is applied to areas of the surface 103 not occupied by metallic structures. In examples, the dielectric solutions 800, 802, when deposited on the surfaces 101, 103, are semi-solid (e.g., have a sufficiently high viscosity) and do not flow, or flow only minimally. The metallic nanowires 116, 118 are porous, and because the dielectric solutions 800, 802 are semi-solid and do not flow (or flow only minimally), the dielectric solutions 800, 802 do not flow (or flow only minimally) into the pores of the metallic nanowires 116, 118. Because the dielectric solutions 800, 802 refrain from substantial flow into the pores of the metallic nanowires 116, 118, the metallic nanowires 116, 118 are not filled with dielectric material and thus largely retain their ability to increase in density when compressed, for example, when pressed against another surface for bonding. This is a technical advantage over, e.g., the use of liquid epoxy, which may flow unimpeded into metallic nanowire pores, preventing the metallic nanowires from compressing as desired and reducing electrical and thermal conductivity in the process. Using the dielectric solution described herein, however, preserves the desired porosity of the metallic nanowires 116, 118. In some examples, the dielectric solutions 800, 802 are deposited using a casting technique or using a printing technique, although other techniques are contemplated and included within the scope of this disclosure. In some examples, the dielectric solutions 800, 802 are deposited such that the lengths of the metallic nanowires 116, 118 extend beyond the lengths of the dielectric solutions 800, 802, as shown. These relative lengths facilitate later bonding of the components 100, 102 to each other, as described below.

Figure 7B:
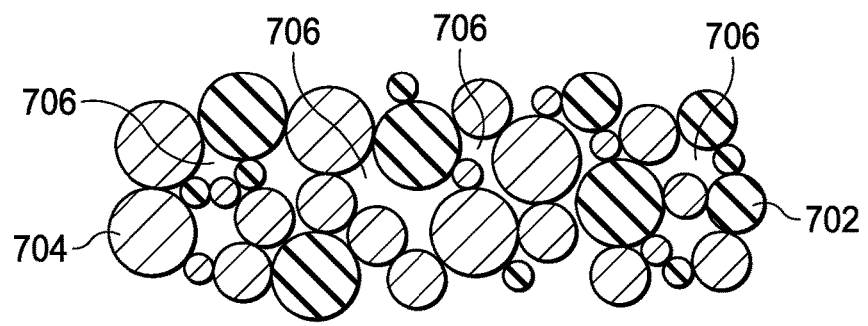

Still referring to FIG. 11, the method 1100 then includes removing the solvent from the dielectric solution, thus forming porous dielectric layers (step 1118). The solvent may be extracted from the dielectric solutions 800, 802, for example, using a vacuum chamber or any other suitable technique. FIG. 7B depicts the resulting dielectric layer, with the polymer particles 702 forming a polymer matrix, and with the polymer particles 702 and the dielectric nanoparticles 704 in contact with each other. Spaces between the polymer particles 702 and the dielectric nanoparticles 704 are pores 706. The pores 706 are, for example, voids filled with air. The aforementioned solvent extraction may be performed at temperatures lower than those used for bonding (FIG. 10) so that the pores 706 form and remain open and do not collapse. In this way, a porous dielectric is formed with a target level of porosity, which improves the mechanical strength and thermal conductivity of the dielectric. The volume of the structure shown in FIG. 7B is reduced compared to that of the semi-solid solution of FIG. 7A due to the removal of the solvent 700. FIG. 9 depicts the structure of FIG. 8, but with the solvent removed, thus resulting in dielectric solutions (which may also be called layers) 800, 802 that are reduced in volume relative to FIG. 8, as shown.

In some examples, some or all of the dielectric nanoparticles 704 comprise metallic nanoparticles that are reacted prior to being mixed in the solution of FIG. 7A. For instance, assuming that such metallic nanoparticles comprise aluminum, the aluminum nanoparticles could be reacted with plasma nitrogen or plasma oxygen to produce dielectric aluminum nitride nanoparticles or aluminum oxide nanoparticles. Alternatively, in some examples, such metallic nanoparticles are reacted after the solvent 700 is removed. For example, plasma nitrogen, plasma oxygen, ammonia, silane, acetone, nitric acid, sulfuric acid, acetylene, ozone, or hydrazine may flow through the pores 706 (FIG. 7B), thereby accessing the metallic nanoparticles for reaction to produce dielectric nanoparticles.

Still referring to FIG. 11, the method 1100 comprises aligning the components and pressing the components together at appropriate temperatures and pressures (step 1120). For example, as explained above, the relatively large surface areas of metallic nanowires result in depressed melting points, thus facilitating bonding of metallic nanowires to other structures at relatively low temperatures and/or pressures. FIG. 10 depicts the structures of the component 100 bonded to the structures of the component 102. As shown, the dielectric layers 800, 802 couple to each other. As shown, the metallic nanowires 116, 118 bond to each other. Because the metallic nanowires 116, 118 were formed to be longer than the dielectric layers 800, 802, the metallic nanowires 116, 118 are able to form mechanically stable and electrically and thermally conductive bonds with the appropriate temperature and pressure combination when the dielectric layers 800, 802 come into contact with each other.

The sets of metallic nanowires 116, 118 may be fused by pressing the two sets of nanowires together, thus generating sufficient heat to cause fusion. (As explained, nanoscale materials may have a substantially increased surface area relative to volume, thus considerably increasing the number of defects on the surface and thereby depressing the melting point of the nanoscale material.) In general, any two nanowires may fuse together at any point or points of contact. In examples, the fusion of two nanowires occurs along the lengths of the nanowires. A fusion along the lengths of two nanowires may be complete, meaning that the entire lengths of the two nanowires are fused together. In some examples, the fusion along the lengths of two nanowires may be incomplete, meaning that only portions of the lengths of the two nanowires are fused together, and these portions may be contiguous or separate. In some examples, a pair of nanowires may fuse together using a distal end of one of the nanowires in the pair. In some examples, three or more nanowires may bunch together and couple together along their lengths or in another suitable manner. In some examples, one or more nanowires may wrap around one or more other nanowires. Any and all such manners of fusion are contemplated and included within the scope of this disclosure.

Fusion between nanowires may occur as a result of nanowires contacting each other with a minimum amount of pressure and/or temperature. For example, at room temperature (e.g., approximately 10 degrees Celsius to approximately 30 degrees Celsius), pressures greater than 100 MPa are sufficient to cause fusion. Temperatures of approximately 80 degrees Celsius may be sufficient to cause fusion without any additional pressure being added. Other combinations of pressure and temperature sufficient to cause melting and subsequent fusion of nanowires also may be used.

As explained above with reference to FIG. 8, when the dielectric material is deposited to form dielectric layers 800, 802, the viscosity of the dielectric material prevents or at least mitigates flow of the dielectric material into the pores of the metallic nanowires 116, 118. Subsequently, when the structures of the components 100, 102 are aligned and pressed together as depicted in FIG. 10, the pores in the dielectric layers 800, 802 enable compression of the dielectric layers 800, 802 without flow of the dielectric material into pores of the metallic nanowires 116, 118. This is because the path of least resistance for the dielectric material of a dielectric layer to flow is into its own pores rather than laterally toward the metallic nanowires 116, 118. Thus, when compressed, the pores of the dielectric layers 800, 802 collapse, preventing or mitigating flow of the dielectric material into the pores of metallic nanowires 116, 118. After compression, one or both of the dielectric layers 800, 802 may retain some porosity, depending on the degree of compression and the porosity of the dielectric layers 800, 802 prior to compression.

Numeral 1000 refers to a dielectric and metallic nanowire bond layer and encompasses all of the structures of FIG. 10 other than the components 100, 102. Thus, the dielectric and metallic nanowire bond layer 1000 bonds (or couples) the components 100, 102 together. The dielectric and metallic nanowire bond layer 1000 provides electrical bonds using the metallic nanowires 116, 118, meaning that the metallic nanowires and their corresponding metallic structures (e.g., metal layers, sets of nanoparticles) should be aligned such that they make electrical contact with appropriate areas of the components 100, 102. For example, if the component 102 is a semiconductor package and the component 100 is a PCB, the metal layers 106A-106D may contact conductive terminals of the semiconductor package, and the metal layers 104A-104D may contact circuitry on the PCB. The dielectric portion of the bond layer 1000 provides thermal conductivity, electrical insulation, and mechanical bonding. Because the dielectric material of the dielectric and metallic nanowire bond layer 1000 does not flow into the pores of the metallic nanowires, the metallic nanowires retain a minimum target level of porosity and are able to densify when compressed, thus forming strong mechanical bonds with good electrical and thermal conductivity. Furthermore, because the dielectric material has a minimum target level of porosity, it retains good thermal conductivity and CTE matching. Such characteristics may be boosted by the presence of dielectric nanoparticles (possibly including reacted metallic nanoparticles) in the dielectric material of the dielectric and metallic nanowire bond layer 1000. The structure of FIG. 10 may be included in any suitable type of electronic device in any suitable type of application.

The various structures of the drawings may not be drawn to scale. In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A method of forming an electronic device, the method comprising:
   providing a first die including a first surface and a second die including a second surface; and
   positioning a bond layer positioned between the first surface and the second surface, the bond layer including a set of metallic wires and a dielectric portion, the dielectric portion comprising a polymer matrix and dielectric nanoparticles.

2. The method of claim 1, wherein the dielectric nanoparticles are selected from the group consisting of silicon nitride, aluminum nitride, boron nitride, and aluminum oxide.

3. The method of claim 1, wherein the dielectric portion is porous.

4. The method of claim 1, wherein the set of metallic wires is a set of metallic nanowires including a length-to-diameter ratio of at least 100:1.

5. The method of claim 1, wherein the bond layer further includes a metal layer coupled to the set of metallic wires.

6. The method of claim 1, wherein the bond layer further includes a metal layer and a set of metallic nanoparticles positioned on the metal layer, the set of metallic nanoparticles coupled to the set of metallic wires.

7. The method of claim 1, wherein the set of metallic wires extend in a direction substantially orthogonal to the first surface or the second surface.

8. The method of claim 1, wherein a viscosity of the dielectric portion is sufficient to prevent flow of the dielectric portion into a pore of a nanowire in the set of metallic nanowires.

9. The method of claim 1, wherein a diameter of a wire in the set of metallic wires ranges between 0.5 microns and 1.5 microns.

10. A method of forming an electronic device, the method comprising:
   providing a component having a surface;
   forming a metal layer on a first portion of the surface of the component;
   forming a set of metallic nanoparticles on the metal layer;
   forming a set of metallic nanowires coupled to the set of metallic nanoparticles; and
   positioning a dielectric layer positioned on a second portion of the surface of the component, the dielectric layer including a polymer matrix and a set of dielectric particles.

11. The method of claim 10, wherein a nanoparticle in the set of metallic nanoparticles has a diameter ranging from 0.5 microns to 1.5 microns.

12. The method of claim 10, wherein a nanowire in the set of metallic nanowires has a diameter ranging from 5 nanometers to 100 microns and a length ranging from 10 microns to 1000 microns.

13. The method of claim 10, wherein a nanowire in the set of metallic nanowires is porous.

14. The method of claim 10, wherein the dielectric layer is porous.

15. The method of claim 10, wherein dielectric particles in the set of dielectric particles are selected from the group consisting of silicon nitride, aluminum nitride, boron nitride, and aluminum oxide.

16. A method for fabricating an electronic device, comprising:
   positioning a metal layer above a surface of a component;
   plating a set of metallic nanowires on the metal layer; and
   positioning a dielectric layer above the surface of the component, the dielectric layer comprising a polymer matrix, a solvent, and a set of nanoparticles,
   wherein the metal layer and the dielectric layer are positioned above different portions of the surface of the component.

17. The method of claim 16, further comprising removing at least some of the solvent to produce a pore in the dielectric layer.

18. The method of claim 16, further comprising reacting a nanoparticle in the set of nanoparticles with plasma nitrogen or plasma oxygen.

19. The method of claim 16, further comprising coupling the dielectric layer and the set of metallic nanowires to another dielectric layer and another set of metallic nanowires, respectively, the another dielectric layer and the another set of metallic nanowires coupled to another component, wherein the coupling comprises applying sufficient temperature, pressure, or a combination of temperature and pressure such that the set of metallic nanowires and the another set of metallic nanowires at least partially fuse to each other.

* * * * *